United States Patent [19]

Harris, Jr.

[11] 4,345,171
[45] Aug. 17, 1982

[54] ADAPTABLE NONLINEAR TRANSMISSION LINE TERMINATOR

[75] Inventor: William S. Harris, Jr., Austin, Tex.

[73] Assignee: Texas Instruments Incorporated, Dallas, Tex.

[21] Appl. No.: 164,379

[22] Filed: Jun. 30, 1980

[51] Int. Cl.³ .......................... H03K 5/08; H03H 7/40
[52] U.S. Cl. ...................................... 307/560; 179/86;
307/360; 307/544; 307/549; 307/564; 328/171;
333/32
[58] Field of Search ............... 307/360, 475, 549, 551,
307/560, 564, 555, 544; 328/171; 179/86;
333/17 L, 17 M, 32

[56] References Cited

U.S. PATENT DOCUMENTS 2,863,123 12/1978 Koch .................................... 307/549
3,937,988 2/1976 De Clue et al. ..................... 307/549

Primary Examiner—John Zazworsky
Attorney, Agent, or Firm—Melvin Sharp; N. Rhys Merrett; Thomas G. Devine

[57] ABSTRACT

A nonlinear transmission line terminator terminates a transmission line having an input from any one of a plurality of logic types. Emitter coupled logic (ECL), transistor logic (TTL), Schottky transistor logic (STTL), low power Schottky transistor transistor logic (LSTTL), complementary MOS (CMOS) and the like are accommodated by impressing the voltage representing a "0" of the logic circuitry being accommodated on one reference terminal and the corresponding "1" voltage on another reference terminal. The terminator presents a very high impedance when the input signal from the transmission line is of an amplitude falling within the "0" and "1" voltage range. When the input signal falls outside the voltage range, the impedance of the terminator matches that of the transmission line to reduce line reflections by providing a path for current to flow from the transmission line to the appropriate one of the "1" or "0" reference terminals. The terminator further has constant current circuitry for maintaining the current flow at or below a predetermined level irrespective of the amplitude of the input voltage signal.

10 Claims, 3 Drawing Figures

ADAPTABLE NONLINEAR TRANSMISSION LINE TERMINATOR

BACKGROUND OF THE INVENTION

1. Field of the Invention

This invention pertains to transmission line terminators and in particular to nonlinear transmission line terminators that are adaptable to terminate signals having different types of logic originations.

2. Description of the Prior Art

In the past, in some high speed digital applications, ordinary passive terminations (resistors) have been used. These terminators reduce or remove the impedance discontinuities and allow the signals to achieve their final values in minimum time, while increasing the power dissipation. These termination resistors must, however, be both matched to the wave impedance of the system and also compatible with the steady-state characteristics of the signal origination. This terminator may be satisfactory for a given type of logic originator. However, it is not adaptable to termination of signals originated by different types of logic circuitry.

In other signal and transmission environments, a nonlinear termination has been successfully used. It is referred to as "nonlinear" because its current versus voltage curve is not linear. It is also referred to as an "active" termination because it is most often implemented with the aid of active devices such as transistors instead of only resistors.

The major limitation to these prior art implementations is that their application is restricted to particular areas. That is, they are designed for specific signal levels. The circuit designed to work with ECL origination, for example, is not at all suited to TTL. This invention is capable of interfacing with many different types of origination logics.

BRIEF SUMMARY OF THE INVENTION

A nonlinear transmission line terminator has a "0" reference terminal upon which a voltage representing a logical "0" of a particular logic type is impressed and a "1" reference terminal upon which a voltage representing a logical "1" is impressed. An input terminal to the circuit is connected to the transmission line on which the originating signals are impressed. Diodes are placed in the lines with the "0" reference terminal, and the "1" reference terminal, and the input terminal line. The diodes are oriented so that no current flows between either of the reference terminals and the input terminal when the voltage signal impressed on the input terminal is within the range defined by the voltages impressed on the reference terminals. Because of this diode blocking configuration, the transmission line is terminated in a very high impedance when the voltage input is within the prescribed range. This enables a very rapid switch from a "1" to a "0" level, and vice versa. However, when the switching is accomplished, and overshoot occurs, if the terminating impedance of the transmission line remains very high, reflections may be generated. To minimize those reflections, the blocking diodes are biased so that they will conduct, in combinations, depending upon which direction the switching occurs. Additionally, a transistor begins conduction under those circumstances to provide, in combination with resistors, the blocking diodes and other circuit components, an impedance that essentially matches the particular line impedance. When the impedance of the line is matched to the terminator, the reflections are greatly reduced.

In addition, to prevent against gross overloads, additional circuitry is provided to place a limit on the current that is able to flow from the input terminal to the pertinent reference terminal through the impedance matching circuitry and the blocking diodes.

In one embodiment, circuitry is also provided to stop the current flow in the event that the input voltage reaches a predetermined limit.

The principle object of this invention is to provide a nonlinear transmission line terminator that is capable, by appropriate voltage references, of terminating a multiplicity of types of originating logic circuitry.

Another object of the invention is to provide overload protection for the terminator.

These and other objects will be made evident in the detailed description that follows.

DETAILED DESCRIPTION OF THE INVENTION

Figure 1:
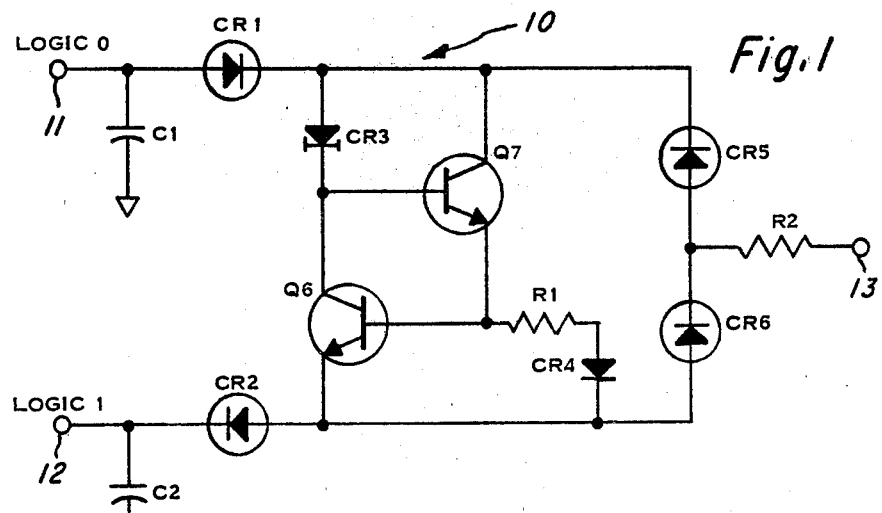
FIG. 1 is a schematic diagram of the nonlinear terminator.

FIG. 1 illustrates nonlinear terminator 10 having logic "0" reference terminal 11 and logic "1" reference terminal 12. The input signal from the transmission line to be terminated is present at terminal 13. The amplitude of the voltage reference to be applied to terminals 11 and 12 is determined by the particular circuitry at the other end of the transmission line which originates the signals sent down the transmission line. Following is a table illustrating various parameters of several logic circuit types:

| PARAMETER | ECL | TTL | STTL | LSTTL | NMOS | CMOS |
|---|---|---|---|---|---|---|
| rise time(ns) | >1.5 | 6–9 | 1.8–2.8 | 4–6 | >10 | 60–120 |
| fall time(ns) | >1.5 | 4–6 | 1.6–2.6 | 2–3 | >10 | 60–120 |
| logic "1" level (v) | −0.8 | 2.4 | 2.7 | 2.7 | 2.4 | 4.5 |
| logic "0" level (v) | −1.6 | 0.4 | 0.5 | 0.5 | 0.4 | 0.5 |

If, for example, an ECL originating circuit is present, than an appropriate potential is placed on terminal 11 such that at −1.6 v diode CR6 conducts and an appropriate potential is placed on terminal 12 such that at −0.8 v diode CR5 conducts. If a TTL circuit is the originating circuit, then an appropriate potential is placed on terminal 11 and an appropriate potential is placed on terminal 12 to cause diode CR6 to conduct at 0.4 v and diode CR5 to conduct at 2.4 v.

Capacitors C1 and C2 are connected to terminals 11 and 12 respectively with the other side of each connected to ground. These capacitors provide filtering. Blocking diode CR1 has it anode connected to terminal 11 and its cathode connected to the cathode of blocking diode CR5 whose anode is connected through resistor R2 to input terminal 13. Blocking diode CR2 has its cathode connected to reference terminal 12 and its anode to the anode of blocking diode CR6 whose cathode is connected through resistor R2 to input terminal 13.

Transistor Q7 has its collector connected to the cathode of diode CR5 and its emitter connected through resistor R1 to the anode of diode CR4 whose cathode is connected to the anode of blocking diode CR6. Current regulator diode CR3 has its anode connected to the cathode of blocking diode CR5 and its cathode connected to the base of transistor Q7. The cathode of diode CR3 is also connected to the collector of transistor Q6 whose emitter is connected to the anode of blocking diode CR6 and whose base is connected to the emitter of transistor Q7.

By way of example, in this preferred embodiment, blocking diodes CR5 and CR6 are type 1N5711 Schotky barrier diodes manufactured by Hewlett Packard; blocking diodes CR1 and CR2 are type 1N914B manufactured by Texas Instruments Incorporated; diode CR3 is a FET current regulator diode, type 1N5305 manufactured by Motorola; transistor Q7 is type TIS98, manufactured by Texas Instruments; transistor Q6 is type A5T2222 manufactured by Texas Instruments; CR4 is type 5082-2835 Schottky barrier diode manufactured by Hewlett Packard; resistor R1 is 24.9 ohms; resistor R2 is 12.1 ohms. In this example, the particular communication line chosen has an impedance of 110 ohms. When the appropriate blocking diodes conduct, together with transistor Q7 and associated components, the total dynamic impedance of terminator 10 is 110 ohms for the particular components listed. This selection is, of course, a matter of design where other selections of components can be made, including the transmission line and its characteristic impedance.

Figure 2:
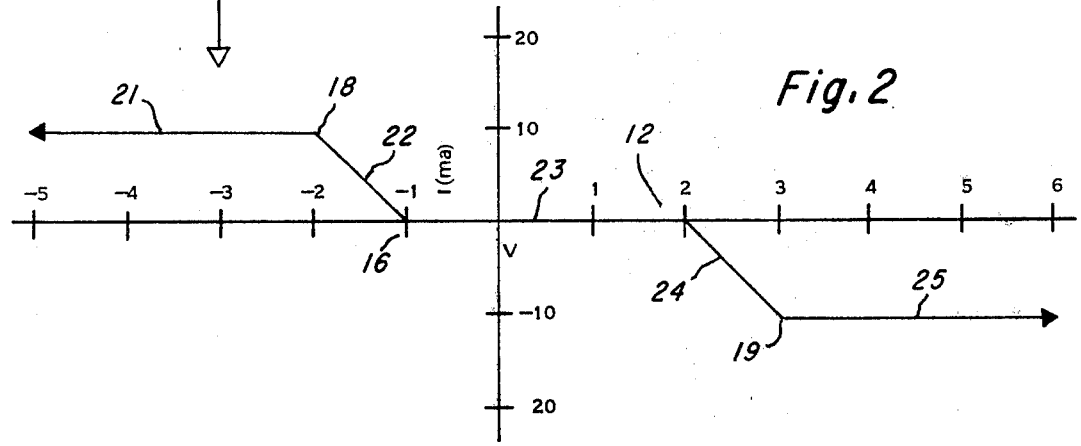
FIG. 2 is a voltage-current graph illustrating the operation of the terminator.

FIG. 2 illustrates the design goal for the static V-I curve for the nonlinear terminator. In this particular example, segment 21 is shown at ten milliamperes joining segment 22 at junction 18. Segment 23 is shown at 0 milliamperes joining segment 24 at junction 17. Segment 25 is shown at −10 milliamperes, joining segment 24 at junction 19. Segment 23 illustrates the period when the input logic signal impressed on input terminal 13 falls within the voltage range established by the voltages impressed on reference terminals 11 and 12. When the voltage swings negatively, then the current rise from junction 16 is as shown by segment 22 as rising to 10 milliamperes at junction 18. Likewise, when the voltage swings positively, then the current flow is as shown in segment 24, rising from junction 17 to −10 milliamperes at junction 19 where the current remains constant as the voltage is increased. The selection of ten milliamperes in this example, is purely arbitrary and another value could be selected. The slope of segments 22 and 24 is equal to 1/110 Siemens when the line impedance is 110 ohms.

Figure 3:
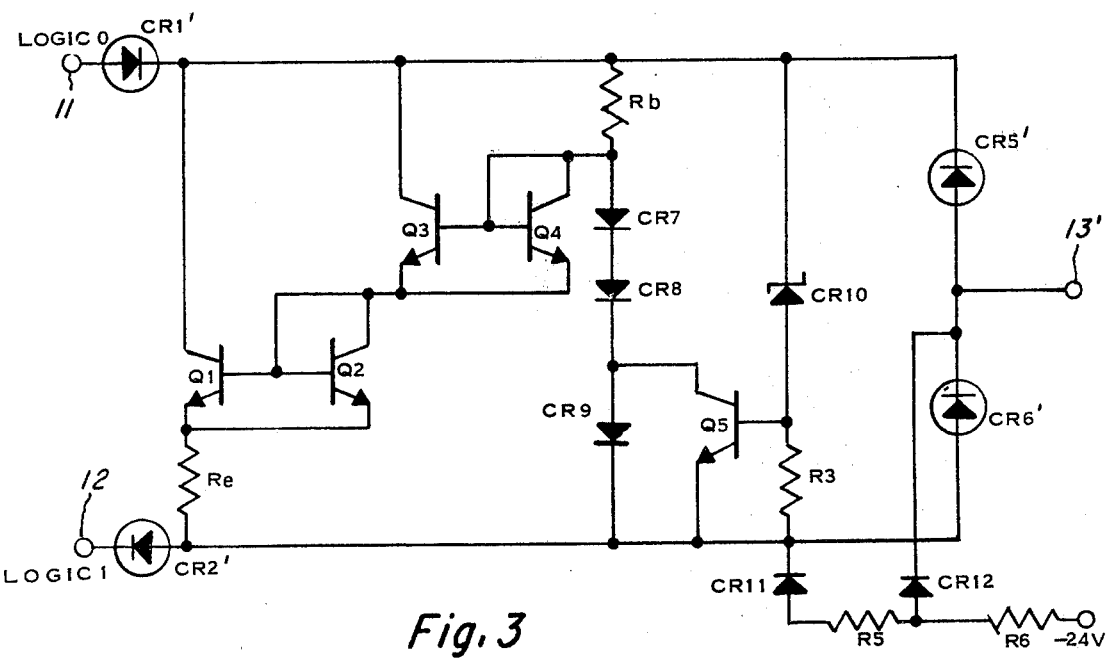
FIG. 3 is a schematic diagram of another embodiment of the terminator.

FIG. 3 is an alternate embodiment of the terminator. It is an embodiment which is suitable for total integration. The implementation provides a circuit that works in essentially the same manner as the circuit described in FIG. 1. One outstanding difference is the addition of transistor Q5, zener diode CR10 and resistor R3. These components provide for a voltage cut off in addition to the current cut off available in the circuit of FIG. 1.

The anode of blocking diode CR1' is connected to logic "0" reference terminal 11 and the cathode is connected to the cathode of blocking diode CR5'. The cathode of blocking diode CR2' is connected to the logic "1" reference terminal 12 and the anode is connected to the anode of blocking diode CR6'. The anode of diode CR5' and the cathode of blocking diode CR6' are connected together to input terminal 13. As in the implementation shown in FIG. 1, these diodes are biased so that no current flows in the circuit when the signal voltage at input terminal 13 falls within the range of voltages defined by the voltages impressed on reference terminals 11 and 12.

Transistor Q1 has its collector connected to the cathode of blocking diode CR5' and its emitter connected through resistor Re to the anode of blocking diode CR6'. It is connected with transistor Q2 in a current mirror configuration. That is, the bases of transistors Q1 and Q2 are tied together as are the emitters. The collector of transistor Q2 is connected to the base junction between transistors Q1 and Q2 and also to the emitters of current mirror transistor pair Q3 and Q4. The collector of transistor Q3 is connected to the cathode of blocking diode CR5', and the collector of transistor Q4 is connected to a junction connecting the bases of transistors Q3 and Q4. This configuration of transistors Q1, Q2, Q3 and Q4 forms an effective calibrated current gain transistor.

One end of resistor Rb is connected to the cathode of diode CR5', the other end being connected to the collector of transistor Q4 and to the anode of diode CR7. The cathode of diode CR7 is connected to the anode of diode CR8 whose cathode is connected to the anode of diode CR9. The cathode of diode CR9 is connected to the anode of blocking diode CR6'.

The collector of transistor Q5 is connected between the cathode of diode CR8 and the anode of diode CR9. The emitter of transistor Q5 is connected to the anode of blocking diode CR6'. Resistor R3 is tied at one end to the anode of blocking diode CR6' and at the other to the base of transistor Q5 and to the anode of zener diode CR10 whose cathode is connected to the cathode of blocking diode CR5'.

The areas of semiconductor material of transistors Q1 and Q3 are equal; the areas of transistors Q2 and Q4 are equal. The areas of diodes CR7–CR9 are selected so that the dynamic voltage drop across transistor current pair Q3 and Q4 is identical to the drop across diode CR7; the drop across CR8 is identical to the drop across transistor mirror current pair Q1 and Q2. The voltage drop across diode CR9 is identical to the drop across resistor Re.

Re+(Rb/$\beta$eff)=110 ohms, where:
Rb is $\geq$10 K ohms,
$\beta$eff=$(\beta X/(\beta+X))^2$, where X is the ratio of emitter areas Q1:Q2 and $\delta$ is the gain of the current mirror transistor pair Q1 and Q2.

By the proper selection of components, this circuit also yield 110 ohms when current is being conducted from input terminal 13 to the appropriate one of reference terminals 11 or 12.

−24 volts is applied through resistor R6 to the anode of diode CR12 whose cathode is connected to the cathode of blocking diode CR6' and through resistor R5 to the anode of diode CR11 whose cathode is tied to the anode of blocking diode CR6'. These components last mentioned provide a bias to the semiconductors material to make it negative with respect to other voltages present.

MODE OF OPERATION

Referring to the FIGURES, if the originating circuit is for example, ECL, then a voltage of −1.6 is impressed on terminal 11 of FIG. 1 or 3 and a voltage of −0.8 is impressed on terminals 12 of FIGS. 1 and 3. As stated earlier, no current flows when the voltage present on input terminal 13 is within the range of −1.6 to −0.8. If, however, there is a change from one state to another, from "0" to "1" and a voltage of −0.2 is reached, then blocking diodes CR5 and CR2 of FIG. 1 conduct (as do CR5' and CR2' of FIG. 3). Transistor Q7 begins conduction through resistor R1 and diode CR4. As the voltage increases, the current through transistor Q7 increases, and in this preferred embodiment, when ten milliamperes is reached, no more current will flow through transistor Q7. This is accomplished by the action of transistor Q6 which begins conduction dependent upon the voltage across resistor R1. It diverts base current to transistor Q7 from current regulating diode CR3, thus limiting the current flow through transistor Q7.

With respect to FIG. 3, the apparatus is controlled in much the same way. That is, when the current through the effective transistor formed by transistors Q1–Q4 exceeds ten milliamperes, then the current is diverted through the series diodes CR7, CR8 and CR9.

In FIG. 3, the zener diode CR10 provides a maximum limit on the signal voltage. If, for example, the diode conducts at twenty volts than transistor Q5 is turned on at that point diverting current away the remainder of the circuit and shutting it off.

FIG. 2, it should be noted, represents a design goal for the static V-I curve for the nonlinear terminator. It should be understood that these line segments 21–25 are not necessarily straight line segments as indicated in FIG. 2 but may well be curved lines.

The need for this terminator with respect to state-of-the-art CMOS and NMOS is marginal. That is, the characteristics of the circuit are such that the nonlinear transmission line terminator of this invention may not be required. However, as the state-of-the-art moves forward in CMOS and NMOS they may well require the sophistication of the terminator of this invention.

Those skilled in the art may change components and parameters without departing from the spirit of this invention whose scope is defined by the appended claims.

What is claimed is:

1. An adaptable nonlinear transmission line terminator comprising:
   (a) a "0" reference terminal upon which a voltage representing a logical "0" is impressed;
   (b) a "1" reference terminal upon which a voltage representing a logical "1" is impressed;
   (c) an input terminal upon which an input signal is impressed;
   (d) current blocking circuitry for blocking current flow between the input terminal and either of the "0" or "1" reference terminals when the input signal voltage amplitude falls within the range defined by the "0" voltage and "1" voltage, presenting high impedance to the transmission line; and
   (e) impedance matching circuitry for reducing line reflection, connected to the current blocking circuitry, to match the impedance of the transmission line when the input signal voltage amplitude falls outside the range defined by the "0" voltage and the "1" voltage, thereby allowing current flow between the input terminal and either of the "0" or "1" reference terminal.

2. The terminator of claim 1 wherein the current blocking circuitry comprises:
   (d) (i) a first diode having its anode electrically connected to the input terminal and its cathode connected to one side of the impedance matching circuitry; and
   (ii) a second diode having its cathode electrically connected to the input terminal and its anode connected to the other side of the impedance matching circuitry.

3. The terminator of claim 2 wherein the current blocking circuitry further comprises:
   (d) (iii) a third diode having its anode electrically connected to the "0" reference terminal and its cathode connected to the one side of the impedance matching circuitry; and
   (iv) a fourth diode having its cathode electrically connected to the "1" reference terminal and its anode connected to the other side of the impedance matching circuitry.

4. The terminator of claim 1 wherein the impedance matching circuitry comprises current limiting circuitry to limit the current flow between the input terminal and either of the "0" or "1" reference terminals to a predetermined maximum amplitude irrespective of the amplitude of the input voltage signal.

5. The terminator of claim 3 wherein the impedance matching circuitry comprises current limiting circuitry to limit the current flow between the input terminal and either of the "0" or "1" reference terminals to a predetermined maximum amplitude irrespective of the amplitude of the input voltage signal.

6. The terminator of claim 5 wherein the impedance matching circuitry further comprises:
   (e) (i) a first transistor having one main electrode connected to the cathode of the first diode;
   (ii) a fixed resistance having one end connected to a second main electrode of the first transistor; and
   (iii) a fifth diode having its anode connected to the other end of the fixed resistance and its cathode connected to the anode of the second diode.

7. The terminator of claim 6 wherein the current limiting circuitry comprises:
   (e) (iv) a constant current diode having its anode connected to the cathode of the first diode, and its cathode connected to the control electrode of the first transistor; and
   (v) a second transistor having one main electrode connected to the control electrode of the first transistor, a second main electrode connected to the anode of the second diode and its control electrode connected to the second main electrode of the first transistor, to limit the drive to the first transistor.

8. The terminator of claim 6 wherein the impedance matching circuitry further comprises:
   (e) (vi) calibrated current gain transistor means having first and second main electrodes connected to the cathode of the first diode;
   (vii) a first resistor having one end connected to the cathode of the first diode and the other end connected to a third main electrode of the calibrated current gain transistor means; and
   (viii) a second resistor having one end connected to a fourth main electrode of the calibrated current gain transistor means and the other end connected to the anode of the second diode.

9. The terminator of claim 8 wherein the current limiting circuitry comprises sixth, seventh and eighth diodes connected in series, the sixth diode having its anode connected to the other end of the first resistor and the eighth diode having its cathode connected to the anode of the second diode.

10. The terminator of claim 9 further comprising voltage limiting circuitry for stopping current conduction when a predetermined voltage is reached.

* * * * *